United States Patent
Toyama (10) Patent No.: US 10,054,097 B2
(45) Date of Patent: Aug. 21, 2018

(54) VEHICULAR CONTROL APPARATUS

(71) Applicant: TOYOTA JIDOSHA KABUSHIKI KAISHA, Toyota-shi (JP)

(72) Inventor: Hiroyuki Toyama, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/319,898

(22) PCT Filed: Jun. 26, 2015

(86) PCT No.: PCT/IB2015/001063
§ 371 (c)(1),
(2) Date: Dec. 19, 2016

(87) PCT Pub. No.: WO2015/198131
PCT Pub. Date: Dec. 30, 2015

(65) Prior Publication Data
US 2017/0145977 A1    May 25, 2017

(30) Foreign Application Priority Data
Jun. 26, 2014 (JP) .................... 2014-131531

(51) Int. Cl.
*F02N 11/08* (2006.01)
*F02D 41/04* (2006.01)
(Continued)

(52) U.S. Cl.
CPC ........ *F02N 11/084* (2013.01); *B60L 11/1859* (2013.01); *B60L 11/1861* (2013.01);
(Continued)

(58) Field of Classification Search
CPC ........ F02D 29/02; F02D 41/04; F02D 41/042; F02D 41/061; F02D 41/062; F02D 41/26;
(Continued)

(56) References Cited

U.S. PATENT DOCUMENTS

2002/0017261 A1* 2/2002 Kuroda ............ F02N 11/0825
123/179.4
2010/0280777 A1* 11/2010 Jin .................. B60L 3/0046
702/63
(Continued)

FOREIGN PATENT DOCUMENTS

EP    2 233 938 A2    9/2010
EP    2 700 964 A2    2/2014
(Continued)

OTHER PUBLICATIONS

International Search Report dated Oct. 19, 2015 in PCT/IB2015/001063 filed Jun. 26, 2015.

*Primary Examiner* — John Kwon
*Assistant Examiner* — Johnny H Hoang
(74) *Attorney, Agent, or Firm* — Oblon, McClelland, Maier & Neustadt, L.L.P.

(57) ABSTRACT

A vehicular control apparatus includes a battery (20), a voltage detection unit (21b), a current detection unit (21a), a first calculation unit, a second calculation unit, a determination unit, and a control unit. The first calculation unit calculates a first SOC of the battery based on an open circuit voltage of the battery. When the accuracy of the first SOC is equal to or more than a predetermined level, the control unit controls a predetermined operation accompanied by charging and/or discharging the battery based on the first SOC. When the accuracy of the first SOC is lower than the predetermined level, the second calculation unit calculates a second SOC by adding a time integrated value to a past first SOC determined to have the accuracy equal to or more than the predetermined level, and the control unit controls the predetermined operation based on the second SOC.

5 Claims, 7 Drawing Sheets

(51) Int. Cl.
  *F02D 41/26* (2006.01)
  *B60L 11/18* (2006.01)
  *B60L 15/20* (2006.01)
  *H02J 7/00* (2006.01)
  *G01R 31/36* (2006.01)
  *F02D 41/06* (2006.01)
  *F02P 5/15* (2006.01)

(52) U.S. Cl.
  CPC ............ *B60L 15/20* (2013.01); *F02D 41/042* (2013.01); *F02D 41/062* (2013.01); *F02D 41/26* (2013.01); *F02P 5/15* (2013.01); *G01R 31/3624* (2013.01); *H02J 7/0047* (2013.01); *H02J 7/0077* (2013.01); *B60L 2240/12* (2013.01); *B60L 2240/441* (2013.01); *B60L 2240/545* (2013.01); *B60L 2240/547* (2013.01); *B60L 2240/549* (2013.01); *B60L 2240/80* (2013.01); *B60L 2260/26* (2013.01); *F02D 2200/503* (2013.01); *H02J 2007/005* (2013.01); *Y02T 10/645* (2013.01); *Y02T 10/705* (2013.01); *Y02T 10/7005* (2013.01); *Y02T 10/7044* (2013.01); *Y02T 10/72* (2013.01); *Y02T 10/7275* (2013.01)

(58) Field of Classification Search
  CPC ..... F02D 2200/503; F02P 5/15; B60W 10/26; B60W 2510/244; Y02T 10/70; Y02T 10/70; Y02T 10/705; Y02T 10/7044
  USPC ................ 701/22, 110–115; 123/319, 339.1, 123/339.11
  See application file for complete search history.

(56) References Cited

U.S. PATENT DOCUMENTS

| | | |
|---|---|---|
| 2010/0283471 A1 | 11/2010 | Lim et al. |
| 2010/0318249 A1* | 12/2010 | Jinno .................... B60K 6/445 701/22 |
| 2012/0259530 A1* | 10/2012 | Wakou ................. F02N 11/084 701/102 |
| 2012/0290235 A1* | 11/2012 | Schaefer ............ G01R 31/3624 702/63 |
| 2014/0055100 A1 | 2/2014 | Igarashi et al. |
| 2015/0210271 A1* | 7/2015 | Yamazaki ............... F02N 11/04 701/22 |
| 2015/0336568 A1* | 11/2015 | Porras .................. B60W 20/00 701/22 |
| 2016/0257287 A1* | 9/2016 | Kato ........................ B60T 7/12 |

FOREIGN PATENT DOCUMENTS

| | | |
|---|---|---|
| JP | 6-351166 A | 12/1994 |
| JP | 2001-4724 A | 1/2001 |
| JP | 2001-157307 A | 6/2001 |
| JP | 2011-202645 A | 10/2011 |
| JP | 2013-24157 A | 2/2013 |

* cited by examiner

FIG. 10

VEHICULAR CONTROL APPARATUS

BACKGROUND OF THE INVENTION

1. Field of the Invention

The invention relates to a vehicular control apparatus that calculates a state of charge (SOC) of an in-vehicle battery and controls a predetermined operation accompanied by charging or discharging the battery on the basis of the calculated state of charge.

2. Description of Related Art

A technique for improving fuel economy of a vehicle by controlling a predetermined operation accompanied by charging or discharging of an in-vehicle battery has conventionally been known (for example, Japanese Patent Application Publication No. 2011-202645 (JP 2011-202645 A) and Japanese Patent Application Publication No. 6-351166 (JP 6-351166 A)).

JP 2011-202645 A discloses a vehicular engine automatic stop/start method for controlling automatic stop and start of an engine (an idle stop operation accompanied by the discharging of the battery). For example, when the vehicle is stopped, the engine is automatically stopped. In this way, fuel consumption during stop of the vehicle can be suppressed, and fuel economy can thereby be improved.

Meanwhile, JP 6-351166 A discloses a vehicular charging control apparatus for controlling an electric power generating operation by an electric power generator (an alternator) that can charge the battery in accordance with the state of charge of the battery. More specifically, an electric power generation voltage is reduced to be lower than a voltage of the battery when the battery is close to be in a fully charged state, so as to reduce an electric power generation amount. On the other hand, when a capacity of the battery is insufficient, the electric power generation voltage is increased to be higher than the voltage of the battery, so as to increase the electric power generation amount. In this way, while the appropriate state of charge of the battery that corresponds to electric power consumption by an auxiliary machine load is secured, an electric power generation load can be reduced and the fuel economy can be improved.

However, there is still room for improvement of the fuel economy that is realized by the above-described control of the predetermined operation accompanied by the charging or discharging of the in-vehicle battery.

For example, in JP 2011-202645 A, in order to prevent a situation in advance where the engine cannot be restarted after the automatic stop, the automatic stop of the engine is suppressed in the case where the calculated SOC of the battery is lower than a preset minimum state of charge. However, if the SOC of the battery is calculated to be lower than the actual SOC, the automatic stop of the engine is suppressed regardless of a fact that the SOC of the battery is equal to or more than the minimum state of charge. In this case, the fuel economy may not sufficiently be improved. In other words, in the case where accuracy of the calculated SOC of the battery is poor, the fuel economy may not sufficiently be improved by the control of the idle stop operation.

In addition, in JP 6-351166 A, if the SOC of the battery is calculated to be lower than the actual SOC, the electric power generation amount is not reduced regardless of a fact that the battery is actually in a fully charged state. In this case, wasteful electric power generation continues, and the fuel economy may not sufficiently be improved. In other words, in the case where the accuracy of the calculated SOC of the battery is poor, the fuel economy may not sufficiently be improved by the control of the electric power generating operation of the alternator.

SUMMARY OF THE INVENTION

The invention provides a vehicular control apparatus that can further improve fuel economy.

A vehicular control apparatus according to a first aspect of the invention includes a battery, a voltage detection unit, a current detection unit, a first calculation unit, a second calculation unit, a determination unit, and a control unit. The battery is mounted in a vehicle. The voltage detection unit is configured to detect a voltage of the battery. The current detection unit is configured to detect a current of the battery. The first calculation unit is configured to calculate a first state of charge of the battery based on an open circuit voltage of the battery, the open circuit voltage being calculated from the voltage detected by the voltage detection unit and the current detected by the current detection unit. The second calculation unit is configured to calculate a second state of charge of the battery by adding, to a reference state of charge of the battery, a time integrated value of the current detected by the current detection unit. The determination unit is configured to determine accuracy of the first state of charge. The control unit is configured to, when the determination unit determines that the accuracy of the first state of charge is equal to or more than a predetermined level, control a predetermined operation accompanied by at least one of charging and discharging of the battery based on the first state of charge. When the determination unit determines that the accuracy of the first state of charge is lower than the predetermined level, the second calculation unit calculates the second state of charge by adding the time integrated value to a past first state of charge that has been calculated by the first calculation unit and that has been determined by the determination unit to have the accuracy equal to or more than the predetermined level, and the control unit controls the predetermined operation based on the second state of charge.

According to the first aspect of the invention, further improvement of the fuel economy can be achieved by controlling the predetermined operation accompanied by the charging or discharging of the battery, such as the idle stop operation or the electric power generating operation by the alternator.

The vehicular control apparatus according to the first aspect of the invention may further include a temperature detection unit configured to detect a temperature of the battery. In addition, the determination unit may be configured to determine the accuracy of the battery in accordance with the temperature detected by the temperature detection unit.

In the first aspect of the invention, the determination unit may be configured to determine the accuracy of the battery to be lower as a deviation between the temperature detected by the temperature detection unit and a predetermined temperature increases.

In the first aspect of the invention, the determination unit may be configured to determine the accuracy of the battery in accordance with elapsed time since an ignition of the vehicle is turned on.

In the first aspect of the invention, the determination unit may be configured to determine the accuracy of the battery to be lower as the elapsed time increases.

The vehicular control apparatus according to the first aspect of the invention may further include: an engine as a drive power source of the vehicle; and an electric power generator configured to generate electric power by rotation of the engine and to charge the battery. In addition, the predetermined operation may be an electric power generating operation by the electric power generator.

The vehicular control apparatus according to the first aspect of the invention may further include: an engine as a drive power source of the vehicle; and a starter configured to start the engine with a power supply from the battery. In addition, the predetermined operation may be an idle stop operation that includes an operation automatically stopping the engine and an operation starting, after the engine is automatically stopped, the engine with the starter.

A vehicular control apparatus according to a second aspect of the invention includes a battery, an engine, a starter, a voltage detection unit, a current detection unit, a first calculation unit, a second calculation unit, and a control unit. The battery is mounted in a vehicle. The engine is a drive power source of the vehicle. The starter is configured to start the engine with a power supply from the battery. The voltage detection unit is configured to detect a voltage of the battery. The current detection unit is configured to detect a current of the battery. The first calculation unit is configured to calculate a first state of charge of the battery based on an open circuit voltage of the battery, the open circuit voltage being calculated from the voltage detected by the voltage detection unit and the current detected by the current detection unit. The second calculation unit is configured to calculate a state of charge of the battery with a time integrated value of the current detected by the current detection unit. The control unit is configured to control an idle stop operation that includes an operation automatically stopping the engine based on the state of charge of the battery and an operation starting, after the engine is automatically stopped, the engine with the starter. The control unit controls the idle stop operation based on a tentative state of charge while a predetermined state that the first state of charge is equal to or less than a first predetermined threshold continues since an ignition of the vehicle is turned on, the tentative state of charge being calculated by the second calculation unit by adding the time integrated value to a previous state of charge of the battery, the previous state of charge being a state of charge based on which the control unit has controlled the idle stop operation in a previous ignition off. When continuation of the predetermined state terminates, or when the first state of charge at a time when the ignition of the vehicle is turned on is higher than the first predetermined threshold, the control unit controls the idle stop operation based on the first state of charge.

According to the second aspect of the invention, further improvement of the fuel economy can be achieved by controlling the idle stop operation.

In the second aspect of the invention, when the continuation of the predetermined state terminates, or when the first state of charge at the time when the ignition of the vehicle is turned on is higher than the first predetermined threshold, the control unit may control, until the ignition of the vehicle is turned off, the idle stop operation based on the first state of charge.

In the second aspect of the invention, when the first state of charge becomes equal to or less than a second predetermined threshold while the predetermined state continues since the ignition of the vehicle is turned on, the control unit may prohibit the idle stop operation. The second predetermined threshold is lower than the first predetermined threshold.

In the second aspect of the invention, when the predetermined state continues since the ignition of the vehicle is turned on, and when the first state of charge becomes equal to or less than a second predetermined threshold in the idle stop operation, the control unit may stop the idle stop operation. The second predetermined threshold is lower than the first predetermined threshold.

In the second aspect of the invention, the second calculation unit may be configured to calculate a second state of charge of the battery by adding, to a reference state of charge of the battery, the time integrated value of the current detected by the current detection unit.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

A description will hereinafter be made on embodiments of the invention with reference to the drawings.

Figure 1:
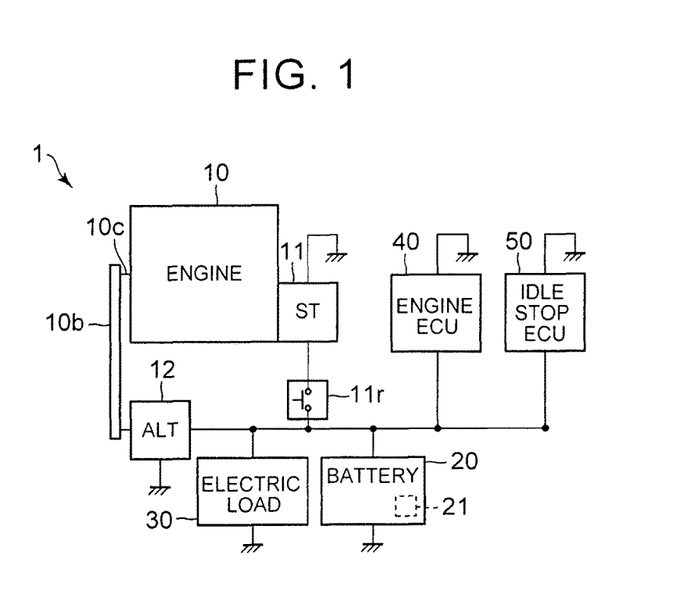
FIG. 1 is a block diagram of an example of a configuration of an electric power supply system in a vehicular control apparatus of a first embodiment of the invention.
Figure 2:
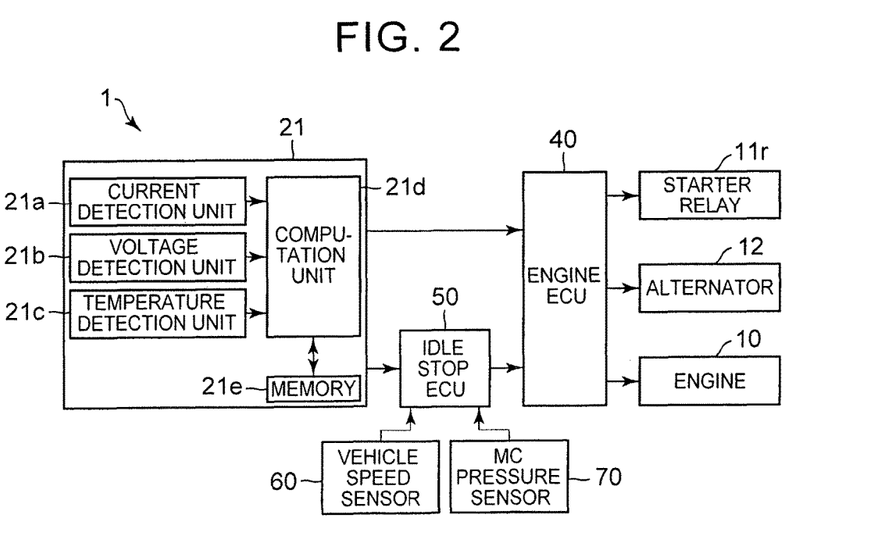
FIG. 2 is a block diagram of an example of a configuration of a control system in the vehicular control apparatus.

FIGS. 1, 2 are views of an example of a configuration of a vehicular control apparatus 1 of a first embodiment. FIG. 1 is a block diagram of an example of a configuration of an electric power supply system in the vehicular control apparatus 1, and FIG. 2 is a block diagram of an example of a configuration of a control system in the vehicular control apparatus 1.

The vehicular control apparatus 1 includes an engine 10, a starter 11, a starter relay 11r, an alternator 12, a battery 20, a battery sensor 21, an electric load 30, an engine ECU 40, an idle stop ECU 50, a vehicle speed sensor 60, an MC pressure sensor 70, and the like.

The engine 10 is a drive power source of a vehicle. The engine 10 is started by the starter 11 that is driven by an electric power supply from the battery 20. Noted that said "start" includes both of normal start of the engine 10 by an operation of an ignition switch (not shown) and start of the engine 10 after stop of the engine 10 by idle stop control, which will be described below.

The starter 11 is start means for starting the engine 10. The starter 11 is driven by the electric power supply from the battery 20.

The starter relay 11r is provided in an electric power supply path from the battery 20 to the starter 11. The starter relay 11r is controlled by the engine ECU 40, which will be described below, and switched between connection (ON) and disconnection (OFF). For example, when the engine 10 is started, the starter relay 11r is connected in correspondence with a command from the engine ECU 40, and drive electric power is supplied to the starter 11.

The alternator 12 is a DC power generator driven by the power of the engine 10, and is constructed of an AC power generator, a rectifier for converting three-phase AC power by the AC power generator to DC power, and the like. The alternator 12 can generate electric power by using the power of the engine 10 that is transmitted from a crankshaft 10c via a belt 10b. In addition, the alternator 12 includes a regulator. When said regulator controls an electric power generation control current (a field current flowing through a rotor coil of the alternator 12), an electric power generation voltage of the alternator 12 can be controlled. Furthermore, since the electric power generation voltage is controlled, the alternator 12 can adjust an electric power generation amount. The electric power generated by the alternator 12 is charged in the battery 20 or supplied as the drive electric power to the electric load 30, the engine ECU 40, the idle stop ECU 50, and the like.

The battery 20 is an electric power storage device that is connected in parallel to the starter 11, the electric load 30, the engine ECU 40, the idle stop ECU 50, and the like and can supply the electric power to these. For example, a lead battery, a nickel hydrogen battery, a lithium ion battery, or the like may be used as the battery 20. A rated voltage (a voltage at both ends) is approximately 12 V. The battery 20 is connected to the alternator 12 and can be charged by the electric power generated by the alternator 12.

The battery sensor 21 is known state detection means for detecting a state of the battery 20 including a state of charge (SOC), and is connected to a negative electrode terminal of the battery 20, for example. The battery sensor 21 is configured to be able to communicate with the engine ECU 40 and the idle stop ECU 50 by an in-vehicle LAN and the like, and sends information on the detected (calculated) state of the battery 20 to the engine ECU 40 and the idle stop ECU 50. The battery sensor 21 includes a current detection unit 21a, a voltage detection unit 21b, a temperature detection unit 21c, a computation unit 21d, a memory 21e, and the like.

The current detection unit 21a detects a current of the battery 20 and a direction thereof (a charged current or a discharged current). The current detection unit 21a, for example, includes a shunt resistor, an A/D converter, and the like. In correspondence with a voltage at both ends of the shunt resistor, the A/D converter outputs a (digital) signal that corresponds to the current of the battery 20 to the computation unit 21d.

The voltage detection unit 21b detects a voltage of the battery 20. The voltage detection unit 21b includes an A/D converter and the like. In correspondence with the voltage of the battery 20, that is, a voltage between terminals, the A/D converter outputs a (digital) signal that corresponds to the voltage of the battery 20 to the computation unit 21d.

The temperature detection unit 21c includes a temperature sensor IC, an A/D converter, and the like. In correspondence with an output voltage of the temperature sensor IC, the A/D converter outputs a (digital) signal corresponding to a temperature of the battery 20 to the computation unit 21d.

The computation unit 21d computes the states (the SOC and the like) of the battery 20 on the basis of the current, the voltage, and the temperature of the battery 20 that are respectively detected by the current detection unit 21a, the voltage detection unit 21b, and the temperature detection unit 21c. Noted that the computation unit 21d constitutes a first SOC calculation unit of this embodiment.

The computation unit 21d first calculates an open circuit voltage (an OCV) of the battery 20, that is, a voltage when the current of the battery 20 is zero, from the detected current and voltage of the battery 20. Next, based on a map that indicates a corresponding relationship between the OCV and the SOC and is stored in the memory 21e in advance, the computation unit 21d calculates the SOC of the battery 20. The computation unit 21d sends the calculated SOC of the battery 20 to the engine ECU 40 and the idle stop ECU 50. In addition, the computation unit 21d outputs the current, the voltage, and the temperature of the battery 20 that are respectively detected by the current detection unit 21a, the voltage detection unit 21b, and the temperature detection unit 21c to the engine ECU 40 and the idle stop ECU 50. A method for calculating the SOC on the basis of the OCV of the battery 20 as described above will hereinafter be referred to as an "OCV method".

Figure 3:
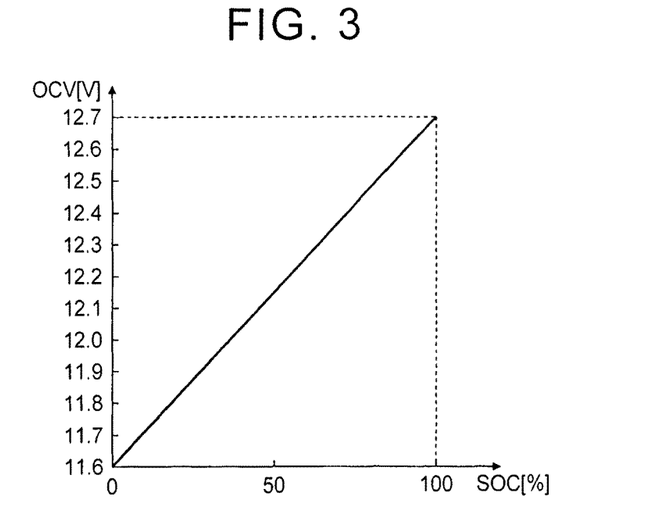
FIG. 3 is a graph for indicating a relationship between an OCV and an SOC.

FIG. 3 is a graph for indicating an example of a relationship between the OCV and the SOC of the battery 20. More specifically, a horizontal axis represents the SOC [%] of the battery 20, a vertical axis represents the OCV [V] of the battery 20, and the relationship between the SOC and the OCV of the battery 20 is represented by a bold solid line.

As shown in FIG. 3, the OCV and the SOC of the battery 20 are in a generally linear relationship. In this example, when the OCV is 12.7 V, the SOC is 100%. The SOC is linearly reduced by reduction of the OCV, and the SOC becomes 0% at 11.6 V.

The SOC of the battery 20 has a linear relationship with an electromotive force (EMF) of the battery 20. Here, it is assumed that the battery 20 is represented by a serial connection model of the EMF and internal resistance and the battery 20 is in electrochemical equilibrium. In this case, since the OCV corresponds to the EMF, as shown in FIG. 3, the SOC of the battery 20 can be expressed by the generally linear corresponding relationship with the OCV. The OCV of the battery 20, which is based on the above assumption, may hereinafter be referred to as a theoretical OCV.

Even when the SOC is the same, the theoretical OCV (EMF) of the battery 20 changes in accordance with the temperature of the battery 20. Thus, the computation unit 21d calculates the SOC of the battery 20 in consideration of the temperature of the battery 20 detected by the temperature detection unit 21c. For example, the computation unit 21d may select a map corresponding to the temperature of the battery 20 from maps that are prepared in advance for each temperature (range) of the battery 20 and indicate the corresponding relationship between the OCV and the SOC. In this way, the computation unit 21d may calculate the SOC of the battery 20 in consideration of the temperature of the battery 20. In addition, a correction map for correcting the SOC, which is calculated from the map for indicating the corresponding relationship between the OCV and the SOC at a particular temperature (for example, 25° C.), in accordance with the temperature of the battery 20 may be prepared in advance, and the computation unit 21d may calculate the SOC of the battery 20 in consideration of the temperature of the battery 20.

In addition, the computation unit 21d calculates information on accuracy (accuracy information) of the SOC of the battery 20 (an error level with respect to the actual SOC of the battery 20) that is calculated by itself by using the OCV method, and sends the information to the engine ECU 40 and the idle stop ECU 50.

For example, when polarization occurs in the battery 20 in association with the charging or discharging thereof, the OCV calculated from the current and the voltage of the battery 20 (hereinafter may be referred to as a measured OCV) is deviated from the theoretical OCV, that is, the EMF. In particular, as time has elapsed since an ignition of said vehicle is turned on (IG-ON), a frequency of the repeated charging and discharging of the battery 20 is increased. Thus, the polarization occurs in the battery 20, and the deviation between the measured OCV and the theoretical OCV is possibly increased.

The deviation between the measured OCV and the theoretical OCV also occurs by the influence of the temperature of the battery 20. For example, when the temperature of the battery 20 is low (for example, −30° C.), elimination of the polarization by the charging or discharging takes longer than normal time (for example, when the temperature of the battery 20 is 25° C.). Accordingly, the deviation between the measured OCV and the theoretical OCV is possibly increased in comparison with that in the normal time. In addition, self-discharging is promoted when the temperature of the battery 20 is relatively high (for example, 70° C.). Thus, the measured OCV is possibly calculated as a lower value than the theoretical OCV.

The computation unit 21d calculates the accuracy information on the basis of a factor (an influencing factor), such as the temperature of the battery 20 or the elapsed time since the IG-ON of said vehicle, that influences the accuracy of the SOC of the battery 20 calculated by using the OCV method. For example, a change in the error of the SOC, which is calculated by using the OCV method, with respect to a change in the influencing factor may be obtained in advance by an experiment, a simulation, or the like. Then, a corresponding relationship between the influencing factor and the generated error level may be mapped in advance. In this way, the computation unit 21d may calculate the accuracy information from said map.

Noted that the computation unit 21d may output the error level of the SOC (for example, 10%), which is computed by using the OCV method, as the accuracy information. In addition, the computation unit 21d may output a value corresponding to said error level (for example, "1" for 5 to 10%, "2" for 10 to 15%, and the like) as the accuracy information.

The memory 21e is storage means. For example, the memory 21e stores the map for indicating the corresponding relationship between the OCV and the SOC, which is used to calculate the SOC of the battery 20 by using the above-described OCV method, a map for calculating the accuracy information of the SOC, which is calculated by using the OCV method, and the like. In addition, the memory 21e may buffer the current, the voltage, the temperature, the calculated SOC, and the like of the battery 20 detected in the past for a predetermined period.

Noted that, the computation unit 21d and the memory 21e may be constructed of a microcomputer, for example, and may execute the above-described various types of processing by executing various programs stored in a ROM on a CPU.

Noted that, instead of the battery sensor 21, a voltage sensor, a current sensor, a temperature sensor, and the like that respectively detect the voltage, the current, the temperature, and the like of the battery 20 may be provided. In this case, the sensors respectively output signals corresponding to the detected voltage, current, temperature, and the like to the engine ECU 40 and the idle stop ECU 50. Then, on the basis of the received signals corresponding to the voltage, the current, the temperature, and the like, the engine ECU 40 and the idle stop ECU 50 calculate the SOC of the battery 20 by using the OCV method and also calculate the accuracy information of the SOC, which is calculated by using the OCV method.

The electric load 30 is connected to the alternator 12 and the battery 20 and actuated by the electric power supplied from these. The electric load 30 may include electrical equipment such as a headlamp, a windshield wiper, an air conditioner, an audio system, an automotive navigation system, and a meter.

The engine ECU 40 is an electronic control unit for controlling the engine 10 and actuated by the electric power supplied from the alternator 12 and the battery 20. The engine ECU 40 may be constructed of a microcomputer, for example, and may execute various types of processing which will be described below, by executing various programs stored in the ROM on the CPU.

For example, on the basis of an accelerator pedal operation amount, a vehicle speed, a crank angle, a cam angle, an engine speed, and the like, the engine ECU 40 controls a fuel injector (fuel injection timing, amount, and the like), an ignition plug (ignition timing and the like), intake/exhaust valves (opening/closing timing and the like), and the like of the engine 10.

In addition, the engine ECU 40 controls an electric power generating operation of the alternator 12 via the regulator in the alternator 12. More specifically, the engine ECU 40 instructs the alternator 12 on the electric power generation voltage (an instruction voltage). Then, when the regulator in the alternator 12 adjusts the field current in correspondence with said instruction voltage, the electric power generation voltage of the alternator 12 is controlled.

Noted that the electric power generating operation of the alternator 12 corresponds to a predetermined operation accompanied by the charging of the battery 20 in this embodiment.

Figure 4:
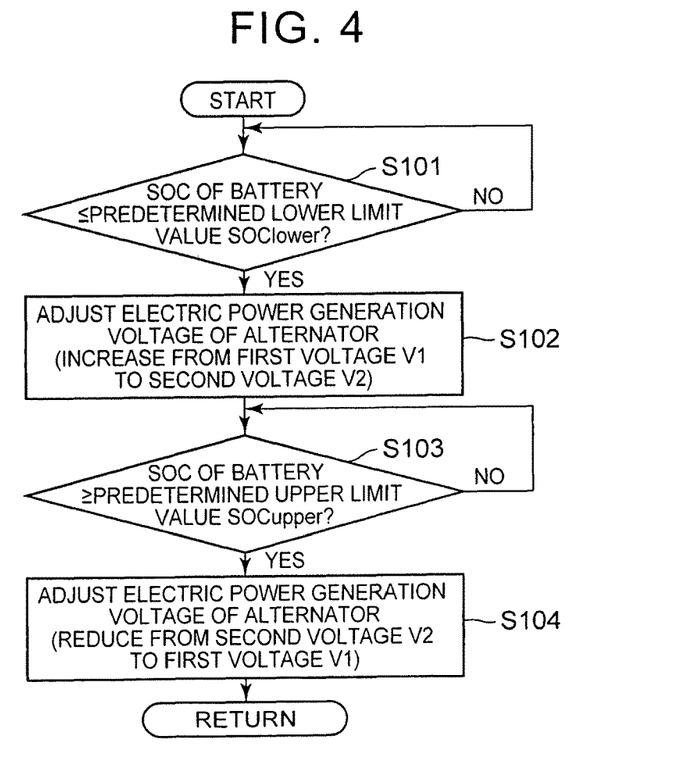
FIG. 4 is a flowchart of an example of electric power generating operation control (electric power generation control) of an alternator by the vehicular control apparatus.

FIG. 4 is a flowchart of an example of electric power generating operation control (electric power generation control) of the alternator 12 by the vehicular control apparatus 1 (the engine ECU 40). Said flowchart is repeatedly executed in a period from the IG-ON to IG-OFF of said vehicle.

Noted that the electric power generation voltage of the alternator 12 is usually set at a first voltage V1 (for example, 12 V).

It is determined in step S101 whether the SOC of the battery 20 is equal to or less than a predetermined lower limit value SOClower. If the SOC of the battery 20 is equal to or less than the predetermined lower limit value SOClower, the process proceeds to step S102. If the SOC of the battery 20 is higher than the predetermined lower limit value SOClower, the determination is repeatedly made until the SOC of the battery 20 becomes equal to or less than the predetermined lower limit value SOClower.

Noted that the predetermined lower limit value SOClower may be set as such a state of charge that deterioration of the battery 20 caused by overdischarging is progressed to a greater degree if the SOC of the battery 20 is reduced therefrom, for example.

In step S102, the electric power generation voltage of the alternator 12 is increased from the first voltage V1 to a second voltage V2 (for example, 14V). In this way, the electric power generation voltage becomes sufficiently higher than the voltage of the battery 20. Thus, charge acceptability of the battery 20 is increased, and the charging of the battery 20 is started. In addition, the electric power generation amount by the alternator 12 is increased.

It is determined in step S103 whether the SOC of the battery 20 is equal to or more than a predetermined upper limit value SOCupper. If the SOC of the battery 20 is equal to or more than the predetermined upper limit value SOCupper, the process proceeds to step S104. If the SOC of the battery 20 is lower than the predetermined upper limit value SOCupper, the determination is repeatedly made until the SOC of the battery 20 becomes equal to or more than the predetermined upper limit value SOCupper.

Noted that the predetermined upper limit value SOCupper may be set as such a state of charge that the deterioration of the battery 20 caused by the overcharging is progressed if the charging thereof continues therefrom, that is, at a full state of charge (the SOC=100%), for example. In addition, the predetermined upper limit value SOCupper may be set as a slightly lower state of charge (for example, the SOC=95%) than the full state of charge at which regenerative electric power generated by the alternator 12 during deceleration of said vehicle can be charged in the battery 20, so as to efficiently collect regenerative energy, for example.

In step S104, the electric power generation voltage of the alternator 12 is reduced (returned) from the second voltage V2 to the first voltage V1. In this way, a difference between the electric power generation voltage of the alternator 12 and the voltage of the battery 20 is eliminated, and the charging of the battery 20 is stopped. In addition, the electric power generation amount is reduced.

As described above, the engine ECU 40 controls the electric power generation voltage of the alternator 12 in accordance with the state of charge (SOC) of the battery 20. In other words, when the state of charge (SOC) of the battery 20 is equal to or more than the predetermined state, the engine ECU 40 reduces the electric power generation voltage of the alternator 12 and stops the charging of the battery 20. In this way, the deterioration of the battery 20 caused by the overcharging can be prevented. In addition, since a load on the alternator 12 is reduced, the fuel economy can be improved. Furthermore, when the state of charge (SOC) of the battery 20 becomes equal to or less than the predetermined state, the engine ECU 40 increases the electric power generation voltage of the alternator 12 and charges the battery 20. In this way, the deterioration of the battery 20 caused by the overdischarging of the battery 20 can be prevented. In addition, the appropriate state of charge of the battery 20 in accordance with the consumed electric power by the loads (the electric load 30, the engine ECU 40, the idle stop ECU 50, and the like) can be secured.

Noted that the electric power generation control of the alternator 12 by the engine ECU 40 is not limited to the above-described mode. Any mode can be applied as long as a charging amount of the battery 20 is controlled by increasing or reducing the electric power generation amount of the alternator 12 in accordance with the SOC of the battery 20. For example, the electric power generation voltage may be adjusted in two stages or more.

In addition, the engine ECU 40 drives the starter 11 by controlling the starter relay 11r that is provided in the power supply path from the battery 20 to the starter 11, and thereby starts the engine 10. For example, when a driver turns on an ignition switch (an IG switch), said ON signal is input to the engine ECU 40. Then, the engine ECU 40 connects the starter relay 11r and thereby starts the engine 10.

Furthermore, the engine ECU 40 receives an engine stop request output from the idle stop ECU 50, which will be described below. Then, the engine ECU 40 cuts off a fuel supply in accordance with said engine stop request and thereby stops the engine 10. Moreover, the engine ECU 40 receives an engine start request output from the idle stop ECU 50. Then, the engine ECU 40 drives the starter 11 by controlling the starter relay 11r in accordance with said engine start request, and thereby starts the engine 10. Just as described, the engine ECU 40 directly executes automatic stop of the engine 10 and start control of the engine 10 after said automatic stop in an idle stop operation.

Noted that the idle stop operation, which includes the automatic stop of the engine 10 and the start of the engine 10 after said automatic stop, corresponds to a predetermined operation accompanied by the discharging of the battery 20 in this embodiment.

In addition, the engine ECU 40 is connected to the engine 10 (various sensors and actuators therein), the battery sensor 21, the idle stop ECU 50, various other sensors, and the like in a manner capable of communicating therewith by the in-vehicle LAN, a direct line, and the like.

The idle stop ECU 50 is an electronic control unit for controlling the idle stop operation of said vehicle and is actuated by the electric power supplied from the alternator 12 and the battery 20. The idle stop ECU 50 may be constructed of a microcomputer, for example, and may execute various types of control processing which will be described below, by executing various programs stored in the ROM on the CPU. More specifically, the idle stop ECU 50 determines whether a predetermined engine stop condition is satisfied. If said engine stop condition is satisfied, the idle stop ECU 50 outputs the engine stop request to the engine ECU 40.

Said engine stop condition includes that master cylinder pressure (hereinafter referred to as MC pressure) is equal to or more than predetermined depression pressure (that a brake pedal depression amount is larger than a predetermined amount). The engine stop condition also includes that the speed of said vehicle is reduced to be equal to or less than a predetermined permitted speed. The engine stop condition further includes that the SOC of the battery 20 is equal to or more than a predetermined permitted threshold SOCpmt. Noted that the predetermined permitted threshold SOCpmt may be set as a sufficiently larger value than a minimum remaining capacity of the battery 20 required for driving the starter 11 and thereby starting the engine 10. Just as described, in the case where a braking operation is performed, where the speed of said vehicle is reduced to be equal to or less than the permitted speed, and where the SOC of the battery 20 corresponds to the remaining capacity that is sufficient to start the engine 10, the idle stop ECU 50 stops the engine 10. In this way, while the fuel economy is improved by the automatic stop of the engine 10, a situation where the engine 10 cannot be started after the automatic stop thereof can be prevented in advance.

In addition, the idle stop ECU 50 determines whether a predetermined engine start condition is satisfied. If said engine start condition is satisfied, the idle stop ECU 50 outputs the engine start request to the engine ECU 40.

Said engine start condition includes that the MC pressure is equal to or less than predetermined released pressure (that depression of a brake pedal is canceled). The engine start condition also includes that the SOC of the battery 20 is equal to or less than a predetermined lower limit threshold SOClmt. Noted that the predetermined lower limit threshold SOClmt may be set as a value obtained by adding a predetermined margin to the minimum required remaining capacity of the battery 20 for driving the starter 11 and thereby starting the engine 10, and may be set as a smaller value than the predetermined permitted threshold SOCpmt described above. Just as described, in the case where the braking operation is canceled, where the SOC of the battery 20 is reduced to the vicinity of the minimum remaining capacity required for starting the engine 10, or the like, the idle stop ECU 50 starts the engine 10. In this way, the engine 10 can be started before the start of the engine 10 becomes impossible. In addition, the deterioration of the battery 20 caused by the extreme reduction of the SOC of the battery 20 can be suppressed.

Noted that each of the engine stop condition and the engine start condition may include a condition other than the above-described conditions related to the vehicle speed, the MC pressure, and the SOC of the battery 20. For example, a condition related to a speed of the engine 10, a coolant temperature, a deteriorated state of the battery 20, a negative pressure sensor (negative pressure of a brake booster), a shift position sensor, a door courtesy switch, or the like may be included.

Figure 5:
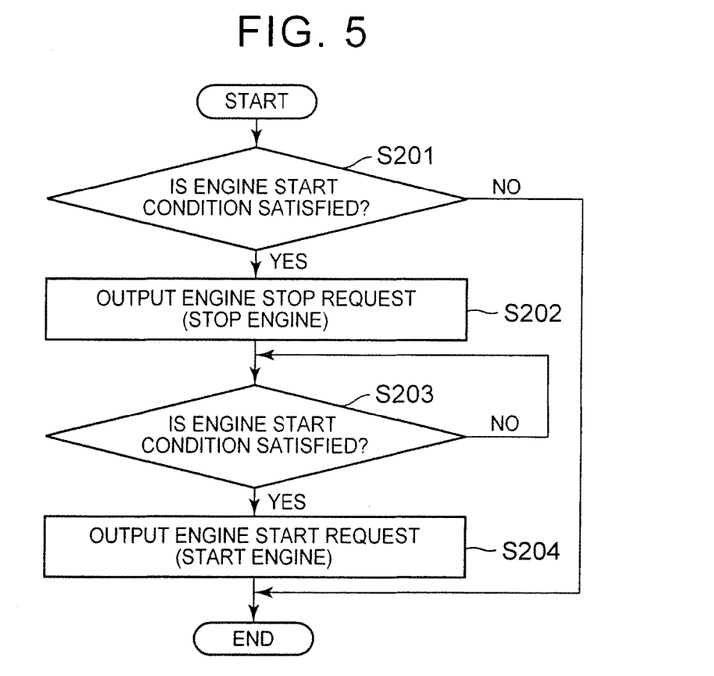
FIG. 5 is a flowchart of an example of idle stop operation control (idle stop control) by the vehicular control apparatus, the control including automatic stop of an engine and start of the engine after said automatic stop.

FIG. 5 is a flowchart of an example of idle stop operation control (the idle stop control) that includes the automatic stop of the engine 10 and the start of the engine 10 after said automatic stop by the vehicular control apparatus 1 (the idle stop ECU 50). Said flowchart may be executed in the case where some conditions included in the engine stop condition are satisfied, for example, in the case where the MC pressure is equal to or more than the predetermined depression pressure and the speed of said vehicle is reduced to be equal to or less than the predetermined permitted speed. In addition, said flowchart may be executed at predetermined time intervals in the period from the IG-ON to the IG-OFF of said vehicle.

In step S201, it is determined whether the engine stop condition is satisfied. If the engine stop condition is satisfied, the process proceeds to step S202. If the engine stop condition is not satisfied, current processing is terminated.

In step S202, the engine stop request is sent to the engine ECU 40, so as to stop the engine 10.

In step S203, it is determined whether the engine start condition is satisfied. If the engine start condition is satisfied, the process proceeds to step S204. If the engine stop condition is not satisfied, said determination is repeatedly made until the engine start condition is satisfied.

In step S204, the engine start request is sent to the engine ECU 40 so as to start the engine 10. Then, the current processing is terminated.

Just as described, the idle stop ECU 50 controls the idle stop operation in accordance with the SOC of the battery 20.

Noted that the idle stop ECU 50 is connected to the battery sensor 21, the engine ECU 40, the vehicle speed sensor 60, the MC pressure sensor 70, and the like in a manner capable of communicating therewith by the in-vehicle LAN, the direct line, and the like.

In addition, the above-described function of each of the engine ECU 40 and the idle stop ECU 50 may be realized by any hardware, software, firmware, or the combination. Furthermore, a part of the function or the entire function of each of the engine ECU 40 and the idle stop ECU 50 may be realized by another ECU. Moreover, the engine ECU 40 and the idle stop ECU 50 may realize a part of a function or an entire function of the other ECU. For example, a part of the function or the entire function of the idle stop ECU 50 may be realized by the engine ECU 40.

The vehicle speed sensor 60 is known detection means for detecting the speed of the vehicle. The vehicle speed sensor 60 is configured to enable communication with the idle stop ECU 50 by the in-vehicle LAN or the like. A signal corresponding to the detected vehicle speed (a vehicle speed signal) is sent to the idle stop ECU 50.

The MC pressure sensor 70 is known detection means for detecting the MC pressure in a master cylinder. The MC pressure sensor 70 is configured to enable communication with the idle stop ECU 50 by the in-vehicle LAN or the like. A signal corresponding to the detected MC pressure (an MC pressure signal) is sent to the idle stop ECU 50.

Next, a description will be made on characteristic processing by the vehicular control apparatus 1 according to this embodiment, that is, processing for switching a calculation method of the SOC of the battery 20 used for the above-described electric power generation control or idle stop control.

Figure 6:
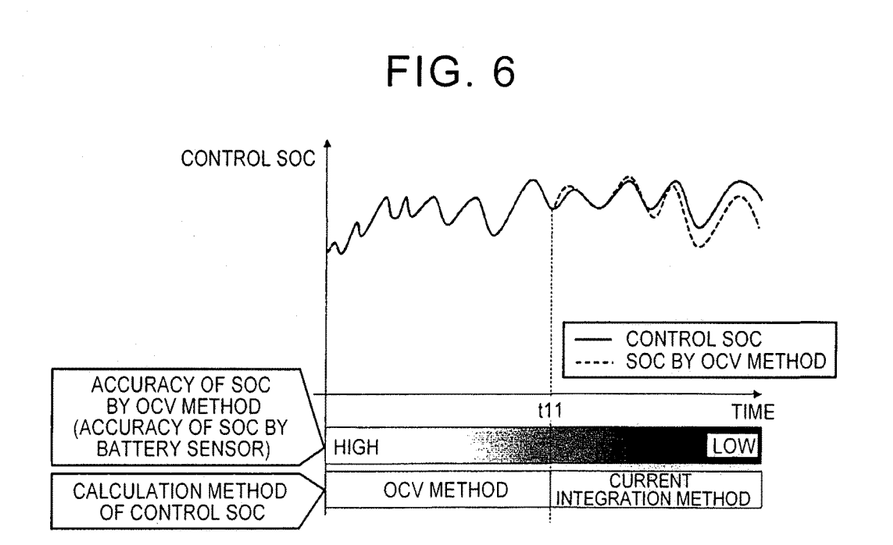
FIG. 6 is a graph for illustrating an example of a method for switching a calculation method of a control SOC by the vehicular control apparatus according to the first embodiment.

FIG. 6 is a graph for illustrating an example of a switching method of the calculation method of control SOC by the vehicular control apparatus 1 according to this embodiment. More specifically, FIG. 6 is a graph of a change in the control SOC with respect to elapsed time with a vertical axis indicating the control SOC (the SOC of the battery 20 used for the electric power generation control or the idle stop control) and a horizontal axis indicating time. In addition, in correspondence with the elapsed time on the graph, the accuracy of the SOC, which is calculated by the battery sensor 21 using the OCV method, and a change in the calculation method of the control SOC are also shown. Noted that a bold line in the graph represents the control SOC and a dotted line represents the SOC calculated by the battery sensor 21 using the OCV method.

Referring to FIG. 6, the above-described electric power generation control or idle stop control is executed from time t10 to t11 by using the SOC of the battery 20 calculated by the battery sensor 21 using the OCV method. In other words, the control SOC is calculated by the OCV method.

Here, as described above, the accuracy of the SOC of the battery 20 calculated by using the OCV method is degraded as the elapsed time from the IG-ON of said vehicle is increased. Accordingly, the accuracy of the SOC calculated by the battery sensor 21 using the OCV method is degraded along with the elapsed time. Then, it is determined at time t11 that the accuracy of the SOC of the battery 20 calculated by using the OCV method becomes lower than the predetermined level (for example, the error has reached the level of 15% or higher), and the calculation method of the control SOC is switched from the OCV method to a current integration method.

The current integration method is a method for calculating the SOC of the battery 20 by adding a value obtained by integrating the current of the battery 20, which is detected by the current detection unit 21a, by time (integrating the charged current as a positive value and the discharged current as a negative value by time) to a certain state of charge (reference state of charge) of the battery 20 as a reference. In this embodiment, the control SOC is calculated by using the current integration method based on the SOC of the battery 20 that has been calculated before the time t11, that is, in the past by the battery sensor 21 using the OCV method and the accuracy of which is higher than the predetermined level. In this example, the control SOC is calculated by using the current integration method based on the SOC calculated by using the OCV method immediately before the time t11, that is, immediately before the accuracy of the SOC calculated by using the OCV method becomes lower than the predetermined level.

Noted that the above-described predetermined level is set to be equal to or less than a level of the accuracy estimated as that of the SOC of the battery 20 calculated by using the current integration method. In this way, the accuracy of the SOC of the battery 20 calculated by using the current integration method can be kept higher than the accuracy of the SOC calculated by using the OCV method. Here, the accuracy of the SOC of the battery 20 calculated by using the current integration method can be calculated (estimated) in advance on the basis of the accuracy of detection of the current of the battery 20 by the current detection unit of the battery sensor 21, an experiment, a simulation, or the like, for example.

At the time t11 onward, the accuracy of the SOC calculated by the battery sensor 21 using the OCV method is further degraded along with the elapsed time. Thus, the electric power generation control or the idle stop control is continued by using the SOC of the battery 20 calculated by using the current integration method.

Figure 7:
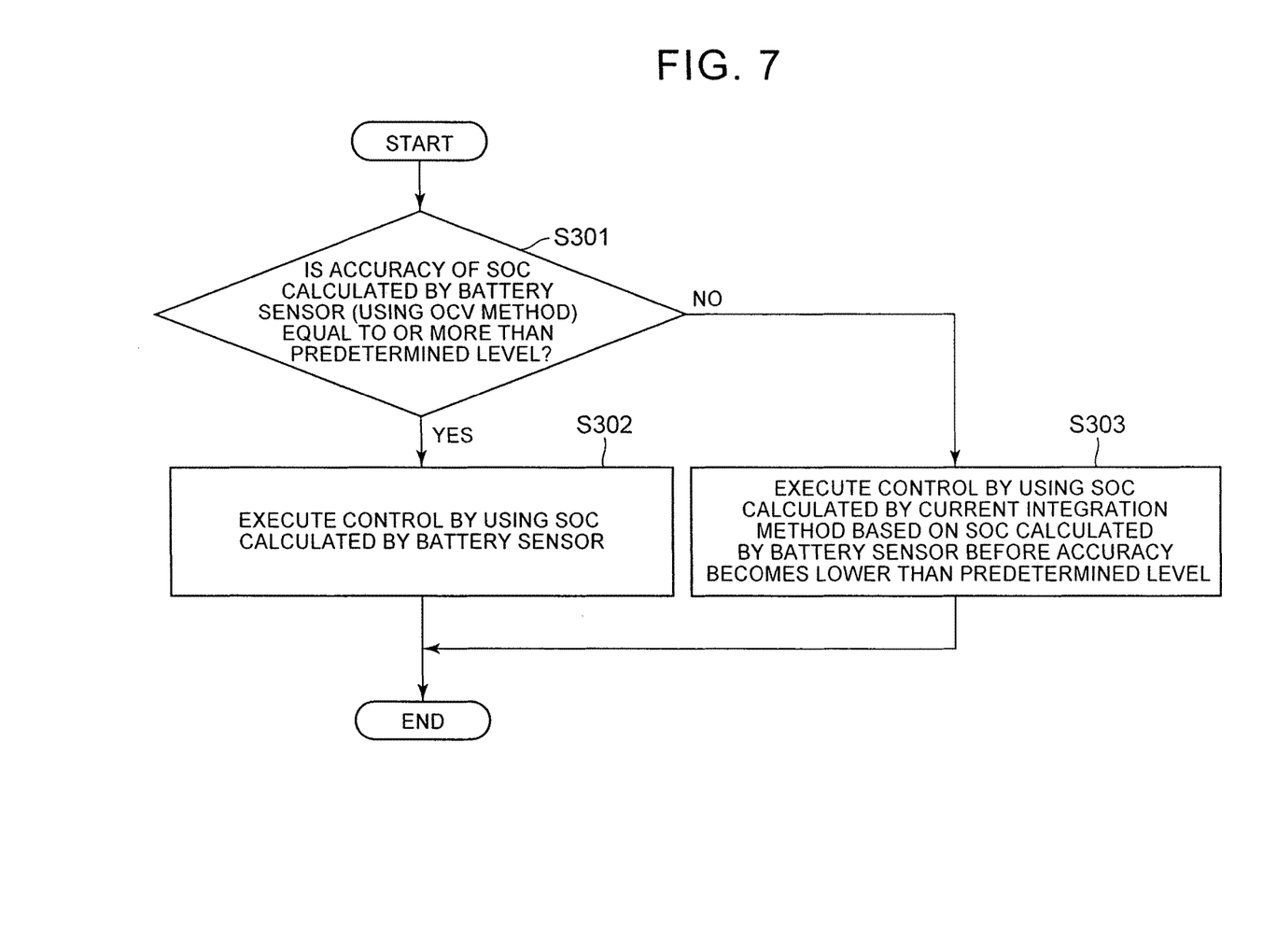
FIG. 7 is a flowchart of an example of control processing by the vehicular control apparatus according to the first embodiment.

FIG. 7 is a flowchart of an example of control processing by the vehicular control apparatus 1 according to this embodiment, that is, processing for switching the calculation method of the SOC of the battery 20 used for the electric power generation control or the idle stop control. Said flow is executed at predetermined time intervals in the period from the IG-ON to the IG-OFF of said vehicle.

Noted that said flowchart may be executed by each of the engine ECU 40 for executing the electric power generation control and the idle stop ECU 50 for executing the idle stop control. In this case, both of the engine ECU 40 and the idle stop ECU 50 constitute a determination unit and a second SOC calculation unit in this embodiment. In addition, one of the engine ECU 40 and the idle stop ECU 50 may execute said flow and transmit the determined control SOC to the other. For example, the engine ECU 40 may execute said flow and determine the control SOC (if the SOC calculated by using the current integration method is determined as the control SOC, the control SOC is calculated) and send the control SOC to the idle stop ECU 50. In this case, the engine ECU 40 constitutes the determination unit and the second SOC calculation unit in this embodiment.

In step S301, it is determined whether the accuracy of the SOC calculated by the battery sensor 21 using the OCV method is equal to or more than the predetermined level on the basis of the accuracy information calculated by the battery sensor 21 (the computation unit 21*d*). If the accuracy of the SOC calculated by the battery sensor 21 using the OCV method is equal to or more than the predetermined level, the process proceeds to step S302. If the accuracy of the SOC calculated by the battery sensor 21 using the OCV method is lower than the predetermined level, the process proceeds to step S303.

In step S302, the electric power generation control or the idle stop control is executed by using the SOC of the battery 20 calculated by the battery sensor 21 using the OCV method. In other words, the SOC of the battery 20 calculated by the battery sensor 21 using the OCV method is determined as the control SOC.

In step S303, the electric power generation control or the idle stop control is executed by using the SOC of the battery 20 calculated by using the current integration method based on the SOC of the battery 20 that has been calculated by the battery sensor 21 using the OCV method in the past and the accuracy of which is equal to or more than the predetermined level. In other words, the SOC of the battery 20 calculated by using the current integration method based on the SOC of the battery 20 that has been calculated by the battery sensor 21 using the OCV method in the past and the accuracy of which is equal to or more than the predetermined level is determined as the control SOC.

As described above, in the vehicular control apparatus 1 according to this embodiment, when the accuracy of the SOC of the battery 20 calculated by using the OCV method becomes lower than the predetermined level, the predetermined operation control accompanied by the charging or discharging of the battery 20 (the electric power generation control or the idle stop control) is executed on the basis of the SOC of the battery 20 calculated by using the current integration method based on the SOC of the battery 20 that has been calculated by the battery sensor 21 using the OCV method in the past and the accuracy of which is equal to or more than the predetermined level. In this way, the accuracy of the SOC of the battery 20 (the control SOC), which is used when the predetermined operation accompanied by the charging or discharging of the battery 20 is controlled, can be prevented from being degraded to be lower than the predetermined level. Thus, the fuel economy can further be improved by controlling the predetermined operation, such as the idle stop operation or the electric power generating operation of the alternator, accompanied by the charging or discharging of the battery 20.

For example, in the case where the SOC calculated to be lower than the actual SOC is used in the electric power generation control, the unnecessary electric power generation by the alternator 12 is continued even after the SOC reaches the predetermined upper limit value SOCupper. Accordingly, the fuel economy may be degraded. In addition, since the actual SOC of the battery 20 is higher than the predetermined upper limit value SOCupper, the regenerative energy cannot sufficiently be collected during the deceleration of said vehicle. Accordingly, the fuel economy may not sufficiently be improved.

In addition, in the case where the SOC calculated to be lower than the actual SOC is used in the idle stop control, it is determined that the actual SOC is lower than the predetermined permitted threshold SOCpmt (the engine stop condition is not satisfied) regardless of a fact that the actual SOC is equal to or more than the predetermined permitted threshold SOCpmt. Accordingly, the automatic stop of the engine 10 may not appropriately be executed. Thus, frequency of the automatic stop of the engine may be reduced, and the fuel economy may not appropriately be improved by the idle stop control.

However, according to the vehicular control apparatus 1 according to this embodiment, the accuracy of the control SOC is kept to be equal to or more than the predetermined level. Thus, a situation where the control SOC is calculated to be lower than the actual SOC to a greater degree than being estimated can be suppressed, and the fuel economy can further be improved.

In addition, since the accuracy of the control SOC is kept to be equal to or more than the predetermined level, the deterioration of the battery 20 can be prevented. Thus, service life of the battery 20 can be extended.

For example, in the case where the SOC calculated to be lower than the actual SOC is used in charging control, the charging of the battery 20 continues. Thus, the deterioration of the battery 20 caused by the overcharging may be progressed. In addition, in the case where the SOC calculated to be higher than the actual SOC is used, the charging of the battery 20 is not started even after the SOC reaches the predetermined lower limit value SOClower. Thus, the deterioration of the battery 20 caused by the overdischarging may be progressed.

Furthermore, in the case where the SOC calculated to be higher than the actual SOC is used in the idle stop control, it is determined that the SOC is higher than the predetermined lower limit threshold SOClmt (the engine start condition is not satisfied) regardless of a fact that the actual SOC is equal to or less than the predetermined lower limit threshold SOClmt. Accordingly, the engine 10 may not appropriately be started. Thus, the SOC of the battery 20 becomes lower than the predetermined lower limit threshold SOClmt, and the deterioration of the battery 20 caused by the overdischarging thereof may be progressed. In addition, a situation where the engine 10 cannot be started automatically may arise.

However, according to the vehicular control apparatus 1 according to this embodiment, the accuracy of the control SOC is kept to be equal to or more than the predetermined level. Accordingly, a situation where the control SOC is calculated to be higher or lower than the actual SOC to the greater degree than being estimated can be suppressed. Thus, the service life of the battery 20 can be extended.

As it has been described so far, in the case where the predetermined operation accompanied by the charging or discharging of the battery 20 is controlled by the vehicular control apparatus 1 according to this embodiment in correspondence with the SOC of the battery 20 calculated by using the OCV method, the influence of the degradation of the accuracy of the SOC of the battery 20 calculated by using the OCV method can be suppressed.

Next, a description will be made on a second embodiment. The vehicular control apparatus 1 according to this embodiment executes the idle stop control by intentionally using the control SOC (tentative control SOC) differing from the actual SOC of the battery 20 while a state that the original control SOC is equal to or less than a first predetermined threshold SOCth1 continues from the IG-ON of said vehicle. The similar components as those in the first embodiment are denoted by the same reference numerals, and a description will hereinafter be focused on different parts from the first embodiment.

Noted that the "original control SOC" means the control SOC used in the normal idle stop control. In this embodiment, the original control SOC means the SOC of the battery 20 calculated by the battery sensor 21 using the OCV method.

Since a configuration of the vehicular control apparatus 1 according to this embodiment is shown in FIGS. 1, 2 as that of the first embodiment, the description thereof will not be made.

In addition, since the processing in the idle stop control by the idle stop ECU 50 is shown in FIG. 5 as that of the first embodiment, the description thereof will not be made.

Next, a description will be made on characteristic processing by the vehicular control apparatus 1 according to this embodiment, that is, processing for switching the calculation method of the SOC of the battery 20 used for the idle stop control.

Figure 8:
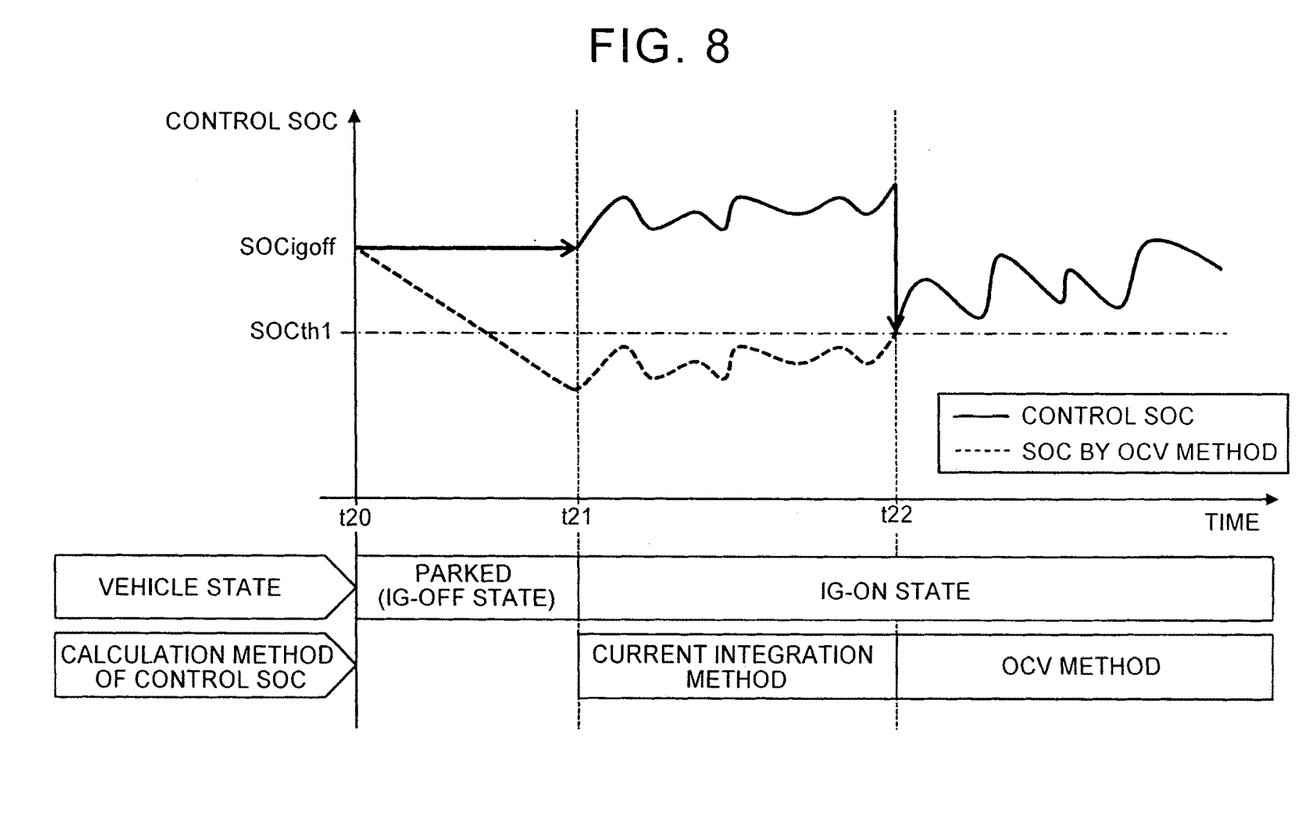
FIG. 8 is a graph for illustrating an example of the method for switching the calculation method of the control SOC by a vehicular control apparatus according to a second embodiment of the invention.

FIG. 8 is a graph for illustrating an example of a method for switching the calculation method of the control SOC by the vehicular control apparatus 1 (the idle stop ECU 50) according to this embodiment. More specifically, FIG. 8 is a graph of the change in the control SOC with respect to the elapsed time with a vertical axis indicating the control SOC (the SOC of the battery 20 used for the idle stop control) and a horizontal axis indicating time. In addition, in correspondence with the elapsed time on the graph, a change in a vehicle state (an IG-ON state or an IG-OFF state) and a change in the calculation method of the control SOC are also shown.

Noted that a bold solid line in the graph represents the control SOC, and a dotted line represents the original control SOC (the SOC calculated by the battery sensor 21 using the OCV method). In addition, the battery sensor 21 wakes up at predetermined time intervals (for example, every 10 minutes) even in the IG-OFF state and calculates the SOC of the battery 20.

Referring to FIG. 8, said vehicle is shifted to the IG-OFF at time t20. Noted that, in this example, the control SOC at a time that said vehicle is shifted to the IG-OFF (during the IG-OFF) is the SOC of the battery 20 calculated by the battery sensor 21 using the OCV method.

In a period from time t20 to t21, said vehicle is parked and in the IG-OFF state. In this period, since the discharging of the battery 20 by a dark current is progressed in said vehicle, the SOC calculated by the battery sensor 21 using the OCV method is gradually reduced from an SOCigoff that is the control SOC during the IG-OFF. Then, the SOC becomes lower than the first predetermined threshold SOCth1, and said vehicle is shifted to the IG-ON at time t21.

In a period from the time t21 to t22, that is, while a state that the original control SOC (the SOC of the battery 20 calculated by the battery sensor 21 using the OCV method) is equal to or less than the first predetermined threshold SOCth1 continues from the time at which said vehicle is shifted to the IG-ON, the idle stop ECU 50 calculates the control SOC by using the current integration method. More specifically, the idle stop ECU 50 calculates the control SOC by adding a value obtained by integrating the current of the battery 20 by the time based on an idle stop control SOC (the SOCigoff) during the IG-OFF. Here, the SOC of the battery 20 is reduced by the dark current even in the IG-OFF state. Accordingly, the control SOC (the tentative control SOC) calculated by using the current integration method with the control SOC during the IG-OFF being the reference is a sufficiently higher value than the actual SOC of the battery 20 (the original control SOC). In other words, the idle stop ECU 50 executes the idle stop control not on the basis of the actual SOC of the battery 20 but on the basis of the tentative control SOC calculated to be higher than the actual SOC.

At the time t22 onward, the SOC of the battery 20 calculated by the battery sensor 21 using the OCV method becomes higher than the first predetermined threshold SOCth1. That is, continuation of the state that the original control SOC (the SOC calculated by using the OCV method) is equal to or less than the first predetermined threshold SOCth1 is terminated. Accordingly, the idle stop ECU 50 switches the calculation method of the control SOC to the OCV method, so as to shift to the normal idle stop control. In other words, the idle stop ECU 50 executes the idle stop control on the basis of the original control SOC (the SOC of the battery 20 calculated by the battery sensor 21 using the OCV method) that corresponds to the actual SOC of the battery 20. Then, the idle stop ECU 50 continuously executes the idle stop control on the basis of the SOC of the battery 20 calculated by the battery sensor 21 using the OCV method until said vehicle is shifted to the IG-OFF.

Noted that, in the case where the original control SOC (the SOC of the battery 20 calculated by the battery sensor 21 using the OCV method) is higher than the first predetermined threshold SOCth1 during the IG-ON of said vehicle, the idle stop ECU 50 executes the normal idle stop control. In other words, the idle stop ECU 50 executes the idle stop control on the basis of the SOC of the battery 20 calculated by the battery sensor 21 using the OCV method in a period from (immediately after) the IG-ON to the IG-OFF.

Here, in the above-described idle stop control, the first predetermined threshold SOCth1 may be set to be equal to or more than the predetermined permitted threshold SOCpmt as a lower limit of the SOC of the battery 20 at which the automatic stop of the engine 10 is permitted. In other words, the idle stop ECU 50 executes the idle stop control on the basis of the tentative control SOC that is calculated to be higher than the actual SOC until the original control SOC corresponding to the actual SOC of the battery 20 is increased to the state that allows the automatic stop of the engine 10 by the idle stop control. In this way, for example, even when a parked period is long and the SOC of the battery 20 is reduced to a certain degree immediately after the IG-ON, the engine 10 can automatically be stopped in an exceptional manner. Thus, the fuel economy can further be improved. In addition, since the frequency of the automatic stop of the engine 10 is reduced, discomfort felt by a user (the driver) can also be alleviated.

Next, a description will be made on an idle stop control method based on the method for switching the calculation method of the idle stop control SOC described by using FIG. 8.

Figure 9:
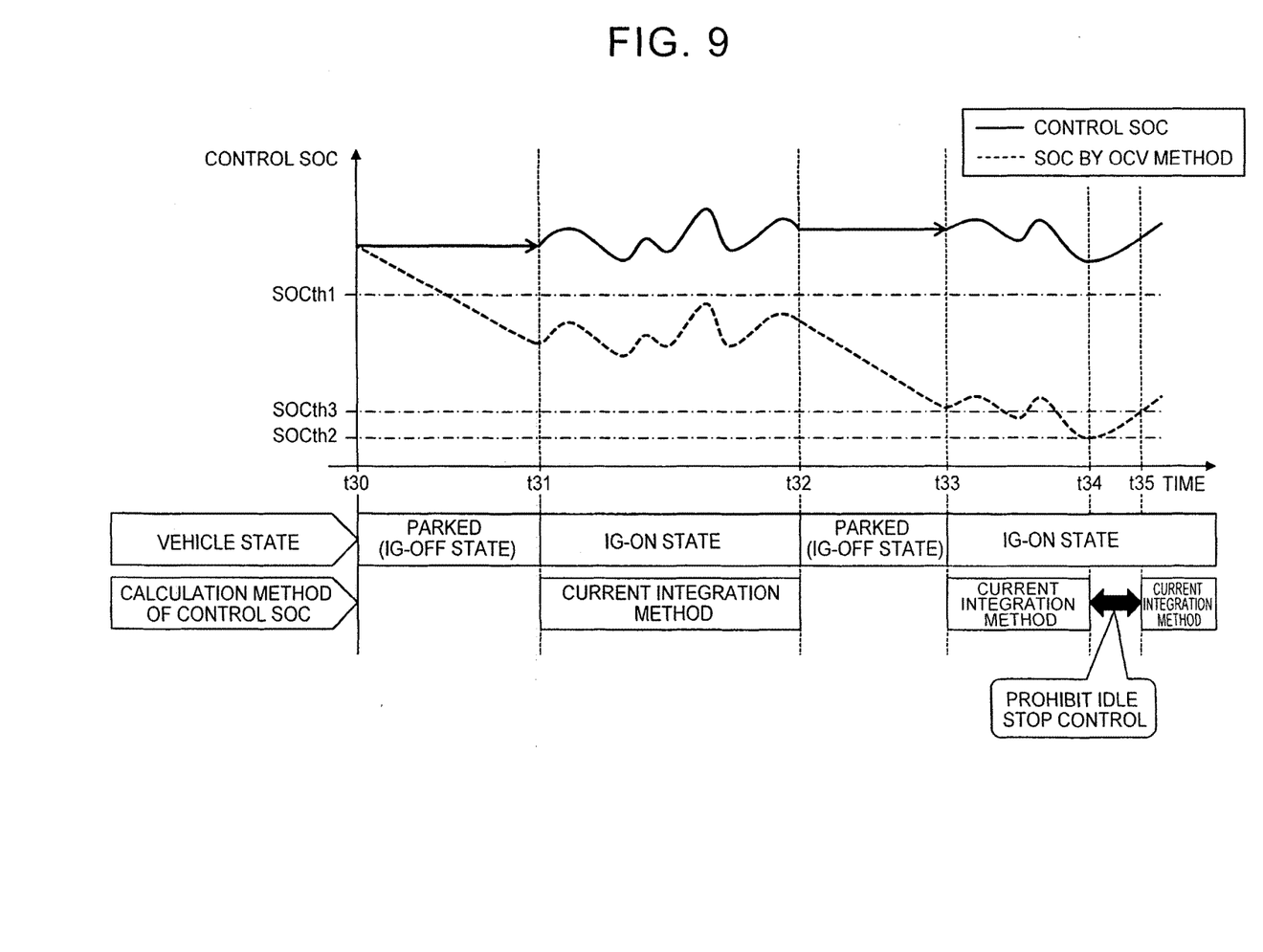
FIG. 9 is a graph for illustrating an example of an idle stop control method by the vehicular control apparatus according to the second embodiment.

FIG. 9 is a graph for illustrating an example of the idle stop control method by the vehicular control apparatus 1 (the idle stop ECU 50) according to this embodiment. More specifically, FIG. 9 is a graph of the change in the control SOC with respect to the elapsed time with a vertical axis indicating the control SOC (the SOC of the battery 20 used for the idle stop control) and a horizontal axis indicating the time. In addition, in correspondence with the elapsed time on the graph, the change in the vehicle state (the IG-ON state or the IG-OFF state) and the change in the calculation method of the control SOC are also shown.

Noted that a bold solid line in the graph represents the control SOC, and a dotted line represents the original control SOC (the SOC calculated by the battery sensor 21 using the OCV method). In addition, the battery sensor 21 wakes up at predetermined time intervals (for example, every 10 minutes) even in the IG-OFF state and calculates the SOC of the battery 20.

Referring to FIG. 9, said vehicle is shifted to the IG-OFF at time t30. Noted that, in this example, the control SOC at the time that said vehicle is shifted to the IG-OFF (during the IG-OFF) is the SOC of the battery 20 calculated by the battery sensor 21 using the OCV method.

In a period from time t30 to t31, said vehicle is parked and in the IG-OFF state. In this period, since the discharging of the battery 20 by the dark current is progressed in said vehicle, the SOC calculated by the battery sensor 21 using the OCV method is gradually reduced from the control SOC during the IG-OFF. Then, the SOC becomes lower than the first predetermined threshold SOCth1, and said vehicle is shifted to the IG-ON at time t31.

In a period from the time t31 to t32, a state that the SOC calculated by using the OCV method after the IG-ON of said vehicle is equal to or less than the first predetermined threshold SOCth1 continues. Thus, similar to FIG. 8, the idle stop ECU 50 calculates the control SOC by using the current integration method. More specifically, the idle stop ECU 50 calculates the control SOC (the tentative control SOC) by adding the value obtained by integrating the current of the battery 20 by the time with the control SOC during the IG-OFF being a reference. Then, the SOC calculated by the battery sensor 21 using the OCV method never exceeds the first predetermined threshold SOCth1, and said vehicle is shifted to the IG-OFF at the time t32.

In a period from the time t32 to t33, said vehicle is parked and in the IG-OFF state, and the SOC of the battery 20 calculated by the battery sensor 21 using the OCV method is gradually reduced by the dark current. Then, at the time t33, said vehicle is shifted to the IG-ON.

In a period from the time t33 to t34, the state that the SOC calculated by using the OCV method after the IG-ON of said vehicle is equal to or less than the first predetermined threshold SOCth1 continues. Thus, similar to FIG. 8, the idle stop ECU 50 calculates the control SOC (the tentative control SOC) by using the current integration method. The control SOC during the last IG-OFF (at the time t32) is the tentative control SOC calculated by the current integration method to be higher than the actual SOC (the original control SOC). Thus, the idle stop ECU 50 adds the value obtained by integrating the current of the battery 20 by the time based on the tentative control SOC during the last IG-OFF, so as to calculate the control SOC (the tentative control SOC).

Meanwhile, the original control SOC (the SOC calculated by the battery sensor 21 using the OCV method) that corresponds to the actual SOC of the battery 20 is further reduced from the above-described first predetermined threshold SOCth1 by the dark current in the IG-OFF state during the time t32 to t33. Then, at the time t34, the original control SOC is reduced to a second predetermined threshold SOCth2.

In a period from the time t34 to time t35, that is, while the original control SOC (the SOC of the battery 20 calculated by the battery sensor 21 using the OCV method) is reduced to be equal to or less than the second predetermined threshold SOCth2 and is then increased to a third predetermined threshold SOCth3, the idle stop ECU 50 stops the idle stop control.

At the time t35 onward, the original control SOC (the SOC of the battery 20 calculated by the battery sensor 21 using the OCV method) becomes higher than the third predetermined threshold SOCth3, and the idle stop ECU 50 restarts the idle stop control.

As described above, the idle stop ECU 50 prohibits the idle stop operation by the idle stop control in the case where the original control SOC is reduced to be equal to or less than the second predetermined threshold SOCth2 while the state that the original control SOC is equal to or less than the first predetermined threshold SOCth1 continues since said vehicle is shifted to the IG-ON. Thereafter, when the original control SOC becomes higher than the third predetermined threshold SOCth3 (>SOCth2), the idle stop ECU 50 restarts the idle stop operation by the idle stop control.

Here, in the above-described the idle stop control, the second predetermined threshold SOCth2 is set to be equal to or more than the predetermined lower limit threshold SOClmt in the engine start condition regarding the SOC of the battery 20. In other words, the idle stop ECU 50 prohibits the idle stop operation before the actual SOC of the battery 20 (the original control. SOC) is reduced to the vicinity of the minimum remaining capacity required for the start of the engine 10. In this way, for example, even when the parked period is long and the SOC of the battery 20 is reduced to the certain degree immediately after the IG-ON, the engine 10 can automatically be stopped in the exceptional manner. In addition, the situation where the engine 10 cannot be started after the automatic stop thereof can be prevented in advance.

Noted that a reason why the idle stop control is not restarted until the SOC of the battery 20 calculated by using the OCV method is increased to be higher than the third predetermined threshold SOCth3, which is higher than the second predetermined threshold SOCth2, is to prevent hunting.

Figure 10:
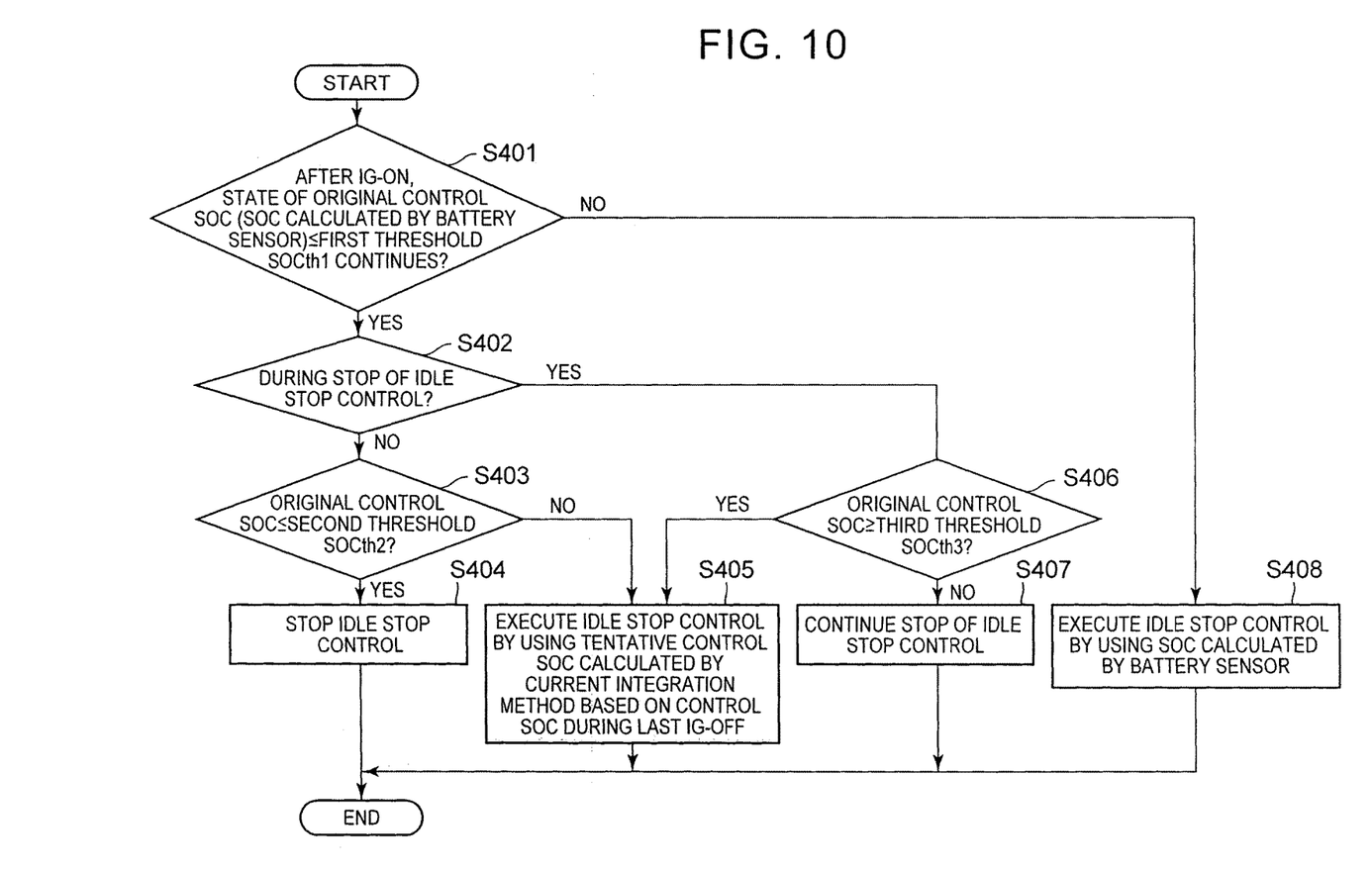
FIG. 10 is a flowchart of an example of idle stop control processing by the vehicular control apparatus according to the second embodiment.

FIG. 10 is a flowchart of an example of control processing by the vehicular control apparatus 1 (the idle stop ECU 50) according to this embodiment, that is, processing for switching the calculation method of the SOC of the battery 20 used for the idle stop control, and corresponds to above-described FIGS. 8, 9. Said flow is executed at predetermined time intervals in the period from the IG-ON to the IG-OFF of said vehicle.

In step S401, after the IG-ON, it is determined whether a state that the original control SOC (the SOC of the battery 20 calculated by the battery sensor 21 using the OCV method) is equal to or less than the first predetermined threshold SOCth1 continues. If said state continues, the process proceeds to step S402. If said state does not continue, the process proceeds to step S408, the idle stop control is executed in accordance with the normal idle stop control, that is, the SOC of the battery 20 calculated by the battery sensor 21 using the OCV method.

In step S402, it is determined whether the idle stop control (by processing of step S404, which will be described below) is stopped (during stop of the idle stop control). If the idle stop control is not stopped, the process proceeds to step S403. If the idle stop control is stopped, the process proceeds to step S406.

In step S403, it is determined whether the original control SOC (the SOC of the battery 20 calculated by the battery sensor 21 using the OCV method) is equal to or less than the second predetermined threshold SOCth2. If the original control SOC is equal to or less than the second predetermined threshold SOCth2, the process proceeds to step S404. If the original control SOC is higher than the second predetermined threshold SOCth2, the process proceeds to step S405.

In step S404, the idle stop control is stopped, and the current processing is terminated.

In step S405, the idle stop control is executed by using the control SOC (the tentative control SOC) calculated by using the current integration method based on the control SOC during the last IG-OFF, and the current processing is terminated.

Meanwhile, it is determined in step S406 whether the original control SOC (the SOC of the battery 20 calculated by the battery sensor 21 using the OCV method) is higher than the third predetermined threshold SOCth3. If the original control SOC is higher than the third predetermined threshold SOCth3, the process proceeds to step S405, and the idle stop control is restarted. If the original control SOC is equal to or less than the third predetermined threshold SOCth3, the process proceeds to step S407.

In step S407, the stop of the idle stop control continues, and the current processing is terminated.

The embodiments of the invention have been described so far in detail. However, the invention is not limited to such particular embodiments, but various changes and modifications can be made within the scope of the gist of the invention.

For example, the method for switching the calculation method of the control SOC according to the first embodiment may be applied in the case where the predetermined operation accompanied by charging or discharging of any in-vehicle battery is controlled on the basis of the SOC of said in-vehicle battery, and thus is not limited to the above-described electric power generation control and idle stop control.

More specifically, the method for switching the calculation method of the control SOC according to the first embodiment may be applied to control of the electric power generating operation by a motor generator (MG) as an electric power generator in a hybrid vehicle (MG electric power generation control), control of start of the engine and stop of the engine in the hybrid vehicle (engine start/stop control), charging control from a high-voltage battery to an auxiliary machine battery in the hybrid vehicle (auxiliary machine battery charging control), and the like.

The MG electric power generation control is, for example, control for driving the MG by the engine when an SOC of the high-voltage battery is reduced to be equal to or less than a predetermined state, so as to cause the MG to generate the electric power, and stopping the electric power generation by the MG when the SOC of the high-voltage battery is recovered to be equal to or more than the predetermined state.

In addition, the engine start/stop control in the hybrid vehicle is control for automatically stopping the engine if a predetermined engine stop condition is satisfied and starting the engine if a predetermined engine start condition is satisfied in a state of the engine stop (which is not limited to after the automatic stop). Said engine stop condition includes a condition related to the SOC of the high-voltage battery (for example, the SOC is in such a degree that the vehicle can travel a predetermined distance at a predetermined speed when the vehicle travels only by a motor with the power supply from the high-voltage battery after the engine stop, or the like). Similarly, said engine start condition includes a condition related to the SOC of the high-voltage battery (for example, the minimum SOC required is available when the vehicle travels only by the motor with the power supply from the high-voltage battery, or the like). Noted that the engine is started by the MG as a starter that is driven by the power supply from the high-voltage battery.

Furthermore, the auxiliary machine battery charging control in the hybrid vehicle is control for starting charging of the auxiliary machine battery from the high-voltage battery when the SOC of the auxiliary machine battery is reduced to be equal to or less than a predetermined value, and stopping said charging when the SOC of the auxiliary machine battery is recovered to be equal to or more than the predetermined value, for example. Noted that the charging from the high-voltage battery to the auxiliary machine battery is executed by actuating a DC-DC converter, for example.

The method for switching the calculation method of the control SOC, which is similar to that of the first embodiment, may also be applied to the MG electric power generation control, the engine start/stop control, the auxiliary machine battery charging control, and the like. In other words, in the case where the accuracy of the SOC of the battery calculated by using the OCV method is reduced to be lower than the predetermined level on a precondition that the control SOC is calculated by using the OCV method, the control SOC may be calculated by using the current integration method based on the SOC of the battery that has been calculated by using the OCV method in the past and the accuracy of which is equal to or more than the predetermined level. Accordingly, it is possible to prevent the accuracy of the control SOC from being degraded to be equal to or less than the predetermined level. Thus, the influence of the degradation of the accuracy of the SOC of the battery calculated by using the OCV method can be suppressed, and each type of the control can appropriately be executed. In other words, the fuel economy can further be improved in the hybrid vehicle. In addition, the deterioration of the battery is prevented by preventing overcharging or overdischarging of the battery, and the service life of the battery can thereby be extended.

In addition, the first embodiment and the second embodiment may be combined. For example, step S408 of the second embodiment may be replaced by processing step that corresponds to steps S301 to S303 in FIG. 7 of the first embodiment. Furthermore, the "original control SOC" of the second embodiment may be the control SOC described in the first embodiment. In other words, when the accuracy of the SOC of the battery 20 calculated by using the OCV method is equal to or more than the predetermined level, the original control SOC may be the SOC of the battery 20 calculated by using the OCV method. Moreover, when said accuracy is lower than the predetermined level, the original control SOC may be the SOC of the battery 20 calculated by using the current integration method based on the SOC of the battery 20 that has been calculated by using the OCV method in the past and the accuracy of which is equal to or more than the predetermined level. In this way, the fuel economy can further be improved by the action according to each of the embodiments. In addition, the effect by the unique action according to each of the embodiments can be obtained.

The invention claimed is:

1. A vehicular control apparatus comprising:
a battery mounted in a vehicle;
an engine as a drive power source of the vehicle;
a starter configured to start the engine with a power supply from the battery;
a voltage detection unit configured to detect a voltage of the battery;
a current detection unit configured to detect a current of the battery;
a first calculation unit configured to calculate a first state of charge of the battery based on an open circuit voltage of the battery, the open circuit voltage being calculated from the voltage detected by the voltage detection unit and the current detected by the current detection unit;
a second calculation unit configured to calculate a second state of charge of the battery with a time integrated value of the current detected by the current detection unit; and
a control unit configured to control an idle stop operation that includes an operation automatically stopping the engine based on the state of charge of the battery and an operation starting, after the engine is automatically stopped, the engine with the starter, wherein
the control unit controls the idle stop operation based on a tentative state of charge while a predetermined state that the first state of charge is equal to or less than a first predetermined threshold continues since an ignition of the vehicle is turned on, the tentative state of charge is based on the second state of charge by adding the time integrated value to a previous state of charge of the battery, the previous state of charge being a state of charge based on which the control unit has controlled the idle stop operation in an immediately previous ignition off, and
when the predetermined state terminates by the first state of charge becoming higher than the first predetermined threshold or when the first state of charge at a time when the ignition of the vehicle is turned on is higher than the first predetermined threshold, the control unit controls the idle stop operation based on the first state of charge.

2. The vehicular control apparatus according to claim 1, wherein
when the continuation of the predetermined state terminates, or when the first state of charge at the time when the ignition of the vehicle is turned on is higher than the first predetermined threshold, the control unit controls, until the ignition of the vehicle is turned off, the idle stop operation based on the first state of charge.

3. The vehicular control apparatus according to claim 1, wherein
when the first state of charge becomes equal to or less than a second predetermined threshold while the predetermined state continues since the ignition of the vehicle is turned on, the control unit prohibits the idle stop operation, and
the second predetermined threshold is lower than the first predetermined threshold.

4. The vehicular control apparatus according to claim 1, wherein
when the predetermined state continues since the ignition of the vehicle is turned on, and when the first state of charge becomes equal to or less than a second predetermined threshold in the idle stop operation, the control unit stops the idle stop operation, and
the second predetermined threshold is lower than the first predetermined threshold.

5. The vehicular control apparatus according to claim 1, wherein
the second calculation unit is configured to calculate a second state of charge of the battery by adding, to a reference state of charge of the battery, the time integrated value of the current detected by the current detection unit.

* * * * *